United States Patent
Moosbrugger et al.

(10) Patent No.: US 8,974,851 B2
(45) Date of Patent: Mar. 10, 2015

(54) METHOD FOR APPLYING A HIGH-TEMPERATURE LUBRICANT

(71) Applicant: Oerlikon Trading AG, Trubbach, Trubbach (CH)

(72) Inventors: Arno Moosbrugger, Hard (AT); Jorg Kerschbaumer, Feldkirch (AT); Theo Bachmann, Haag (CH); Mario Wolfgang Walch, Balzers (LI)

(73) Assignee: Oerlikon Surface Solutions AG, Trubbach, Trubbach (CH)

( * ) Notice: Subject to any disclaimer, the term of this patent is extended or adjusted under 35 U.S.C. 154(b) by 0 days.

(21) Appl. No.: 14/177,326

(22) Filed: Feb. 11, 2014

(65) Prior Publication Data
US 2014/0193572 A1  Jul. 10, 2014

Related U.S. Application Data

(63) Continuation of application No. 13/322,198, filed as application No. PCT/EP2010/001061 on Feb. 19, 2010, now abandoned.

(30) Foreign Application Priority Data
May 28, 2009 (DE) .......................... 10 2009 022 982

(51) Int. Cl.
*C23C 26/00* (2006.01)
*B05D 5/08* (2006.01)
*C10M 103/06* (2006.01)

(52) U.S. Cl.
CPC ............... *B05D 5/08* (2013.01); *C10M 103/06* (2013.01); *C10M 2201/0613* (2013.01); *C10N 2230/06* (2013.01); *C10N 2240/06* (2013.01); *C10N 2250/08* (2013.01); *C10N 2270/00* (2013.01)
USPC .......................................................... 427/11

(58) Field of Classification Search
USPC .......................................................... 427/11
See application file for complete search history.

(56) References Cited

U.S. PATENT DOCUMENTS

| | | | |
|---|---|---|---|
| 3,415,625 A | 12/1968 | Babl | |
| 4,430,184 A * | 2/1984 | Mularie | 204/192.38 |
| 5,320,989 A * | 6/1994 | Chapman et al. | 501/96.4 |
| 5,409,622 A * | 4/1995 | Chapman et al. | 508/137 |
| 6,511,701 B1 | 1/2003 | Divigalpitiya | |
| 2006/0207502 A1* | 9/2006 | Dhindsa et al. | 118/715 |

FOREIGN PATENT DOCUMENTS

JP  2009-062443 A  3/2009
WO  03/027213 A1  4/2003

OTHER PUBLICATIONS

International Search Report for PCT/EP2010/001061 dated Jun. 2, 2010.

* cited by examiner

*Primary Examiner* — Kelly M Gambetta
(74) *Attorney, Agent, or Firm* — Pearne & Gordon LLP

(57) ABSTRACT

The present invention relates to a method for applying hexagonal boron nitride to a rough surface, wherein it is intended for the boron nitride to be provided as a temperature-resistant lubricant of the surface. According to the invention, a pin composed of hexagonal boron nitride is rubbed with pressure over the rough surface, such that abraded boron nitride adheres to the surface.

2 Claims, 1 Drawing Sheet

METHOD FOR APPLYING A HIGH-TEMPERATURE LUBRICANT

Figure 1:
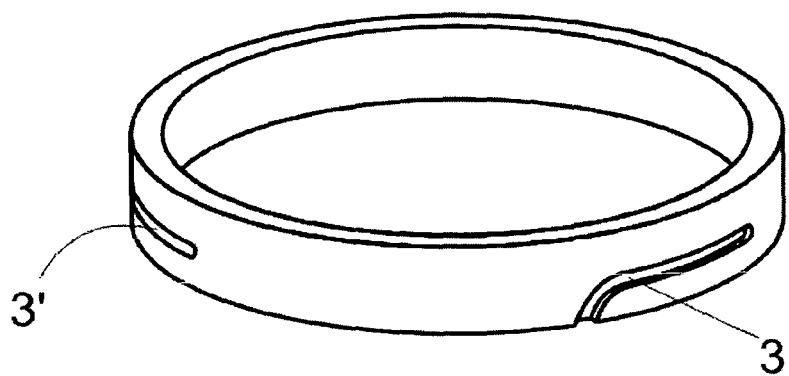

The present invention relates to a method for applying a high-temperature lubricant onto the surface of a component of a vacuum coating source.

Lubricants are a widely used means for reducing the mechanical wear and tear of components rubbing against each other. In this respect, it is also known that the lubricants must be adapted to environmental conditions. A lubricant that is used in a vacuum coating chamber must be vacuum-compatible. For example, molybdenum disulfide ($MoS_2$) can be used. A lubricant that is to be used in an environment with high temperatures must be able to withstand these temperatures. $MoS_2$ can however be used only up to a temperature of 450° C. For higher temperatures up to 1200° C., hexagonal boron nitride (hBN), also known as inorganic or white graphite, is suitable.

Usually, the lubricants that are to be applied are sprayed or brushed onto the surface to be treated. When spraying, a liquid (e.g. alcohol) in which lubricant particles are suspended is used as base material. When brushing, a fine powder made of lubricant particles is used. Both are easy and cost-effective known methods. These methods work well in the case of $MoS_2$, as this material is sufficiently soft and adheres to the rough surface. This however does not apply to hBN. If hBN is sprayed or brushed onto a rough surface, it essentially lies loosely on the surface and can be easily wiped off. Sprayed or brushed boron nitride layers must therefore be renewed frequently if one does not wish to risk seeing the parts that rub one another becoming quickly worn and broken.

There is therefore a need for a method that allows for hexagonal boron nitride (hBN) to be applied adhesively onto a rough surface in an easy manner in such a way that essential components of the applied boron nitride layer cannot be easily wiped off.

In the inventive method, a solid piece that essentially includes pressed hBN powder is rubbed over the rough surface in such a way that hBN is abraded from the solid piece. This is achieved in that the solid body is moved over the surface with pressure and remains stuck onto the surface to be treated. Because of the fact that the hBN is no longer in loose powder form but rather that a plurality of powder particles are mechanically locked to one another, i.e. form conglomerates and these conglomerates probably interlock with the rough surface, the hBN can no longer be easily rubbed off from the surface.

The solid body is preferably obtained by means of a sintering process. For this purpose, powder masses of hBN for example are chosen and pre-pressed in such a way that the powder particles are bound together. The so-called pre-pressed green body thus obtained is subsequently solidified and densified below melting point.

The hBN solid piece is preferably given the shape of a pin and/or pencil lead. A pin, in the framework of this description, is to be understood as an element whose length exceeds its width by at least one order of magnitude and whose height is on the same order of magnitude as its width, wherein the width is not greater than 8 mm. Pins having a cylinder shape, with a lead diameter of 1 mm to 5 mm, have proven effective. Diameters of 2 to 4 mm are preferably used. Such a lead can be operated particularly well with a lead-holder corresponding to that of a so-called mechanical pencil. In this respect, clutch pencils are to be used preferably to fine-lead pencils as it is possible with standard mechanical pencils to work with greater lead diameters.

The invention will now be described in detail on the basis of an example and with the aid of figures.

Figure 2:
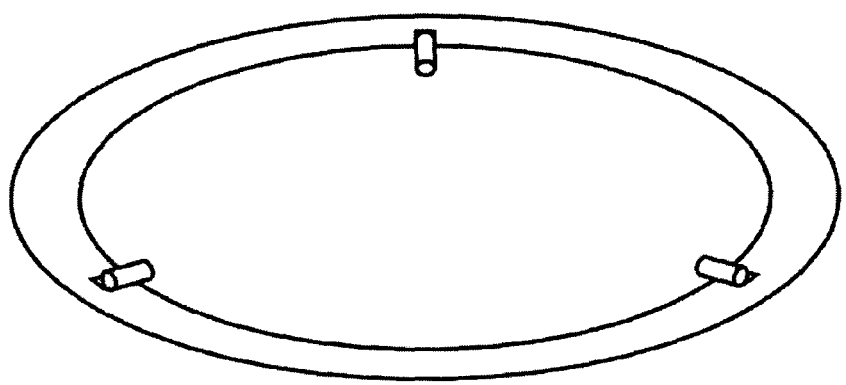
Figure 3:

FIG. 1 shows a ring having bayonet slits.
FIG. 2 shows a ring holder and pins.
FIG. 3 shows a clutch pencil.

The example relates to an arc-vaporization source (ARC sources) that can be used to coat work pieces under vacuum. ARC sources require a hanging electrically insulated confinement ring that ensures that the spark remains on the target surface during operation. During operation, this ring is coated and reaches a temperatures of up to 700° C. In the example, the ring is made of stainless steel.

To ensure a reliable operation of the ARC source, the coating must be regularly removed from the confinement ring. This usually occurs by sandblasting the confinement ring. To this effect, the ring must be regularly removed. An electrically insulating vacuum-compatible confinement ring holder is thus required that can withstand temperatures up to 700° C. and that allows the ring to be easily removed. This is achieved here with 3 bayonet slits 3, 3' (in FIG. 1 only two of them are visible) milled into the sides of the confinement ring and in which electrically insulating or insulated pins of the ring holder engage. The ring holder and the pins are represented schematically in FIG. 2.

The material chosen for the pin must be a material that exhibits both mechanical stability as well as the required temperature stability and that is electrically insulating. In this respect, a ceramic such as for example $ZO_2$, SiN or $Al_2O_3$ can be considered, wherein $Al_2O_3$ is the most cost-effective but also the most brittle material and SiN, although the least brittle, is however the most expensive material. $ZO_2$ constitutes a good compromise between cost and stability.

Brittleness plays a role inasmuch as through the periodical removal and refitting of the confinement ring, strong mechanical loads bear on the pins. Additionally, the sandblasting will cause the surface of the confinement ring and in particular the surface of the lateral bayonet slits to be strongly roughened. When opening or closing the bayonet catch, considerable friction forces will thus occur that could easily lead to the pin breaking off in the absence of any lubricant.

According to the invention, the bayonet slits are thus "painted" with hBN, by rubbing with pressure a cylindrical pin of sintered hBN over the surface of the bayonet slits. The cylindrical pin has a diameter that is smaller than the width of the bayonet slit so that it can be inserted into the slits. In the example, the bayonet slits have a width of 5 mm and the cylindrical hBN pin has a diameter of 4 mm. The pressure with which it is rubbed over the surface should be sufficient to ensure a coarse abrasion of the hBN material. It should however not be so great that the hBN pin breaks. In practice, a pressure between 5 bar and 50 bar has proven effective. A pressure between 10 bar and 40 bar is preferably used. A pressure of 30 bar is particularly preferred. In the example, for a lead diameter of 4 mm a force of about 30N was applied. For the abrasion and adhesion of the hBN onto the surface, it is advantageous in this connection for the surface to be roughened through prior sandblasting.

As previously mentioned, the hBN pin can be held directly or in a lead holder, preferably in a clutch pencil. Such a clutch pencil is shown schematically in FIG. 3. The holder makes operation easier. Such holders for pencil leads of up to 3.8 mm in diameter are available nowadays as standard.

What is claimed is:

1. Method for applying hexagonal boron nitride as lubricant onto a surface of bayonet slits of a confinement ring of an ARC source, characterized in that hexagonal boron nitride is prepared in the form of a solid piece and this solid piece is rubbed over the surface to be lubricated in such a manner that boron nitride components are abraded from the solid piece and adhere to the surface as abrasion.

2. Method according to claim 1, characterized in that the solid piece is obtained essentially through sintering of hexagonal boron nitride.

\* \* \* \* \*